(12) United States Patent
Kwon

(10) Patent No.: US 6,251,695 B1
(45) Date of Patent: Jun. 26, 2001

(54) MULTICHIP MODULE PACKAGING PROCESS FOR KNOWN GOOD DIE BURN-IN

(75) Inventor: Young I. Kwon, San Jose, CA (US)

(73) Assignee: S3 Graphics Co., Ltd., St. Kitts and Nevis (KN)

( * ) Notice: Subject to any disclaimer, the term of this patent is extended or adjusted under 35 U.S.C. 154(b) by 0 days.

(21) Appl. No.: 09/388,997

(22) Filed: Sep. 1, 1999

(51) Int. Cl.[7] .................................................. H01L 21/66
(52) U.S. Cl. .............................. 438/14; 438/15; 438/113; 438/114
(58) Field of Search ..................... 438/14, 15, 107–109, 438/113, 114, 977; 257/678, 723, 787

(56) References Cited

U.S. PATENT DOCUMENTS

| | | | |
|---|---|---|---|
| 4,344,064 | 8/1982 | Bitler et al. | 338/334 |
| 5,280,193 | 1/1994 | Lin et al. | 257/723 |
| 5,754,410 | 5/1998 | Bardsley et al. | 361/777 |
| 6,117,693 | * 9/2000 | Fogal et al. | 438/14 |

FOREIGN PATENT DOCUMENTS

| | | |
|---|---|---|
| 04 322 439 | 11/1992 | (JP) . |
| 05 074 829 | 3/1993 | (JP) . |

* cited by examiner

Primary Examiner—David Nelms
Assistant Examiner—Dung A Le
(74) Attorney, Agent, or Firm—Carr & Ferrell LLP

(57) ABSTRACT

A method of packaging and testing integrated circuit dies includes coupling a first integrated circuit to the substrate; encapsulating the first integrated circuit; and then testing the first integrated circuit. If testing is successful, a second integrated circuit is coupled to the substrate. In addition, the method may include encapsulating the second integrated circuit so that the first and second integrated circuits are part of a single monolithic module, such as a multichip module. The second integrated circuit may also be tested after encapsulation. The present invention may also be practiced by encapsulating and testing lesser value die before encapsulating higher value die. This reduces the chance that a higher value die will be rendered unusable because one of the lower value dies attached to the substrate is subsequently found defective after the higher value die has been encapsulated and/or tested.

38 Claims, 3 Drawing Sheets

MULTICHIP MODULE PACKAGING PROCESS FOR KNOWN GOOD DIE BURN-IN

BACKGROUND

1. Field of the Invention

The present invention relates to semiconductor packaging, and more particularly, the present invention relates to multichip module packaging.

2. The Background Art

The term "multichip module" is commonly used to refer to an electronic component having multiple integrated circuit dies that, when electronically combined, function as a system- or board-level unit. As seen in FIG. 1, the creation of the module usually includes receiving 10 each of the integrated circuit die, such as die 12 and die 14, in bare die form and attaching 16 each die to a suitable substrate 18. After attachment, the input/output (I/O) pads of each die are coupled electrically 20 to the I/O pads of substrate 18 either through a wire bonding process or flip-chip process. (The flip-chip process is not shown). An encapsulation step 22 is then preformed, where the integrated circuit dies 12 and 14, bonding wires 24 (if applicable), and substrate 18 are encapsulated by a protective material 26, such as epoxy. Encapsulation protects the bare dies and provides a robust and compact package, or multichip module 28, having all of the features that are offered by the combined integrated circuit dies.

At reference number 32, pin-out 30 is formed on substrate 18. Pin-out 30 is typically, but not always, formed opposite to the surface facing the attached integrated circuit die, and is for coupling electrically multichip module 28 to another substrate, such as a printed circuit board (not shown). Pin out 30 may be any high-density area connection (e.g., ball grid array, pin grid array or the like) or package configuration (e.g., dual in-line package (DIP), small out-line package (SOP), thin small out-line package (TSOP), small out-line J-lead (SOJ), quad flat pack (QFP), or the like). Multichip module 28 is then tested and burned-in to ensure proper operation (not shown).

FIG. 1 depicts the attachment and packaging of integrated circuit die onto a single substrate (shown in cross-section). Those of ordinary skill in the art will readily recognize that the substrate is typically part of a group of attached substrates (hereinafter referred to as a "substrate strip"). Hence, each of the substrates must be detached from the substrate strip after the formation of their corresponding multichip module but before testing and burn-in of each module. The entire substrate strip is not shown in FIG. 1 to avoid overcomplicating the disclosure.

Multichip module packaging technology has the advantage of shortening circuit design time because the designer is not constrained to design the entire target circuit or fabricate the entire target circuit on a single silicon die. Instead, the designer can obtain all or some of the integrated circuits from semiconductor vendors that produce the integrated circuits required in bare die form. For example, a graphics designer seeking to directly couple RAM memory functions with a graphics accelerator may obtain a DRAM integrated circuit die from a DRAM vendor. The graphics designer may then combine the DRAM integrated circuit die with the designer's graphics integrated circuit die by packaging the die circuits in a multichip module. Thus, a designer can rapidly construct a target circuit by obtaining some integrated circuit portions required in the target circuit from available vendors in bare die form.

However, multichip module technology is relatively expensive because module yield is dependent on the yield of each of the integrated circuit dies combined in each multichip module. Since each integrated circuit die used is packaged with other dies before system testing, any one die failing after packaging results in a defective multichip module regardless of whether the remaining dies in the module are not defective. The susceptibility of die failure after packaging due to use (such as when burned-in and/or tested for a period of time) is commonly known as die infant mortality. Die infant mortality increases packaging costs because the remaining integrated circuit dies in the module have already been encapsulated with the defective die and thus, cannot be re-used. Consequently, all it takes is one defective integrated circuit die in a multichip module to render the entire multichip module defective.

There have been prior attempts in identifying before packaging non-defective integrated circuit bare die, i.e., integrated circuit die that has the same level of quality as a die that as been packaged, tested, and burned-in. Such a non-defective integrated circuit in bare die form is commonly referred to as "known good die". One solution includes testing each integrated circuit in bare die form by placing the die in a suitable carrier or temporary package and then testing the circuit against a set of specified requirements. This solution is expensive because it includes using a temporary package or carrier, and inserting and removing the die from the temporary package or carrier.

In another approach, each integrated circuit die in bare die form is placed in a specialized and miniature test socket, tested, and burned-in before placement of each die onto the substrate. This requires strict tolerances because the I/O pads on the die must be aligned with the test carrier bare die sockets, which are used during die testing. In addition, this solution suffers from temperature and frequency limitations due to parasitic capacitance, cross talk, and cost.

Accordingly, there exists a need for an improved method of packaging integrated circuit dies into a multichip module.

SUMMARY

The present invention is a method of packaging and testing integrated circuit dies that are coupled to a substrate. The method includes coupling a first integrated circuit to the substrate; encapsulating the first integrated circuit; and then testing the first integrated circuit. If testing is successful, a second integrated circuit is coupled to the substrate.

In addition, the method may include encapsulating the second integrated circuit so that the first and second integrated circuits are part of a single monolithic module, such as a multichip module. The second integrated circuit may also be tested after encapsulation. The present invention may also be practiced by encapsulating and testing lesser value die before encapsulating higher value die. This reduces the chance that a higher value die will be rendered unusable because one of the lower value dies attached to the substrate is subsequently found defective after the higher value die has been encapsulated and/or tested.

DETAILED DESCRIPTION OF THE PREFERRED EMBODIMENTS

Figure 1:
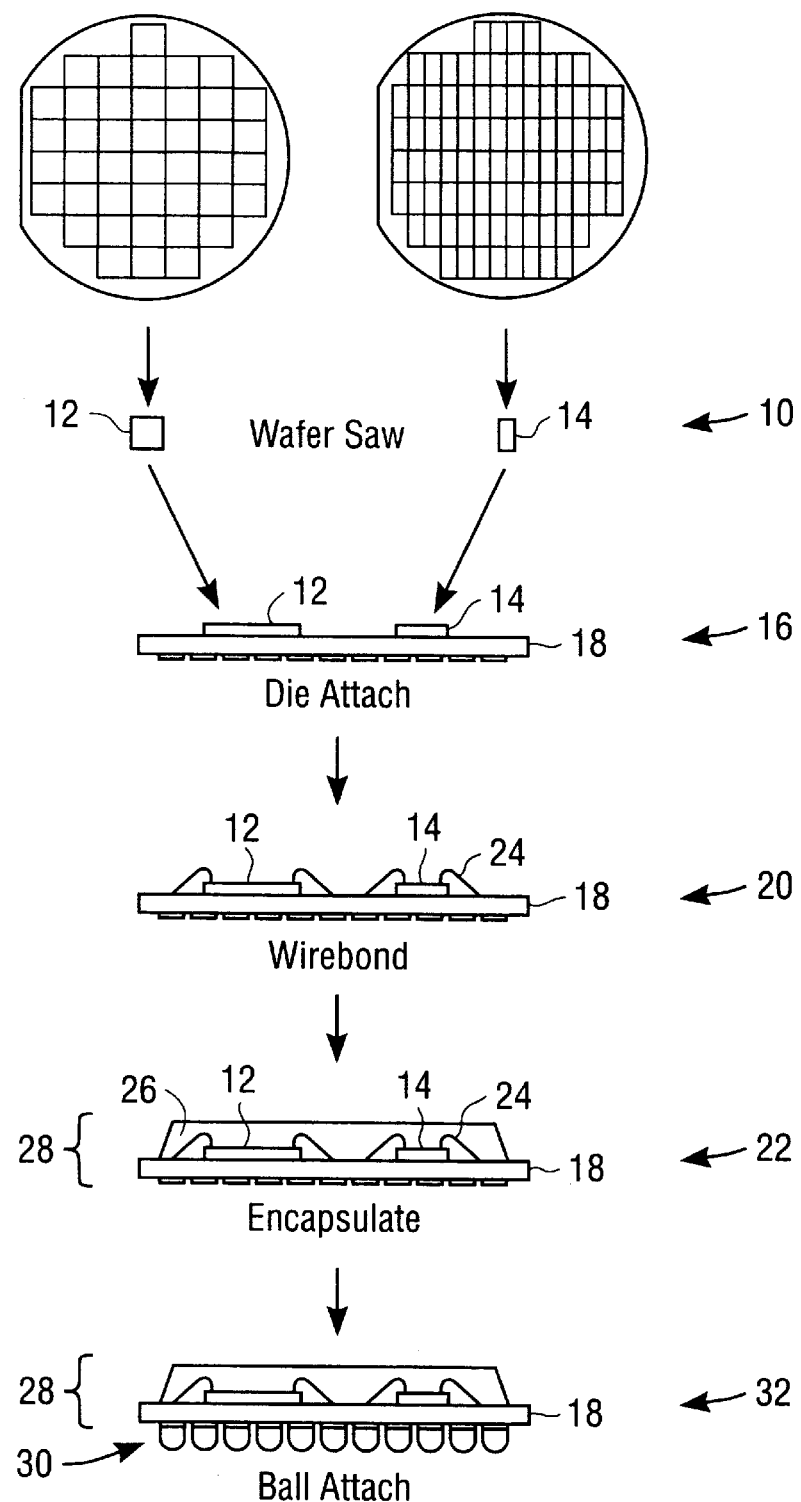
FIG. 1 is a block diagram showing a known method of forming a single multichip module depicted in cross-section.
Figure 2:
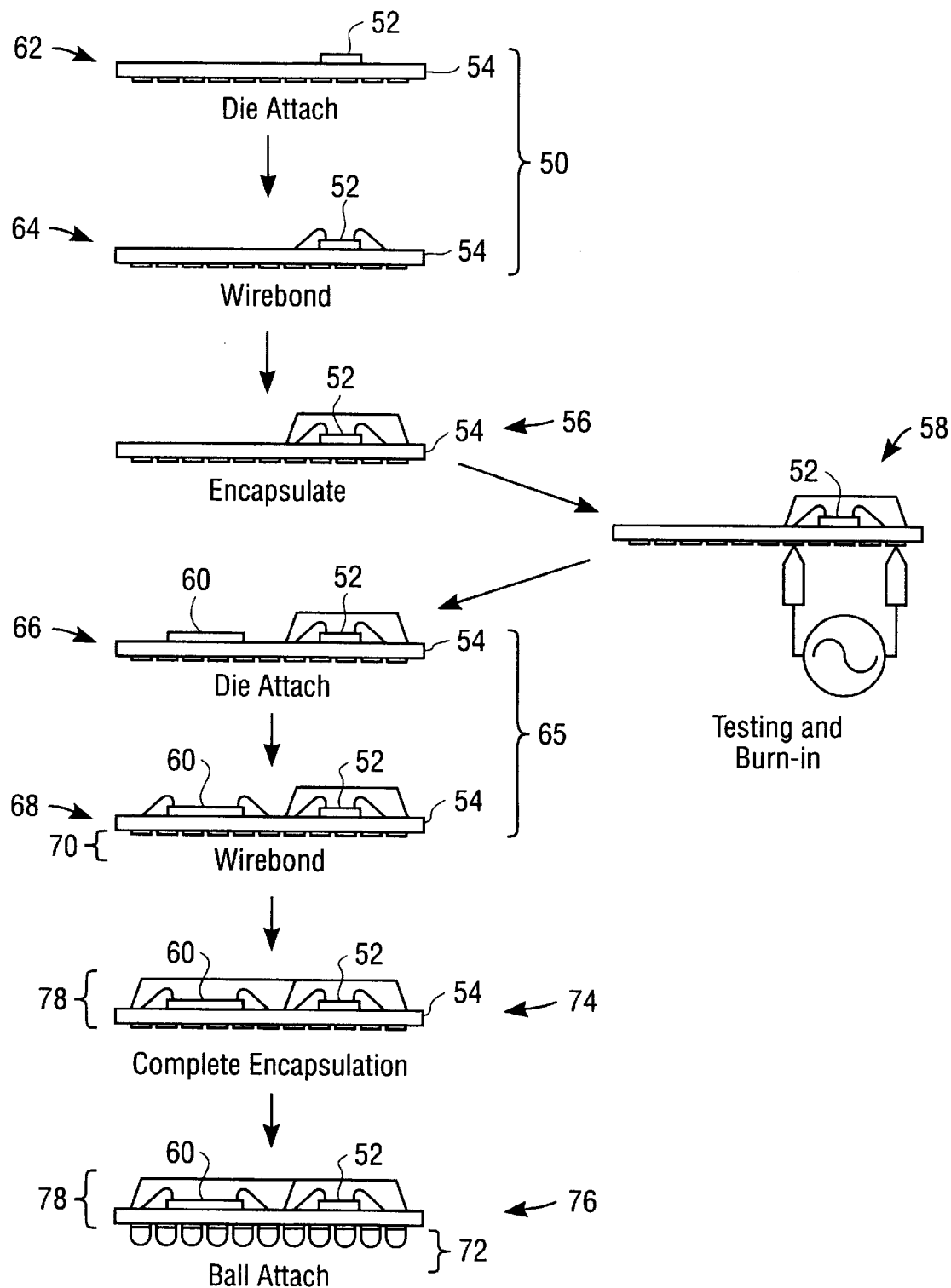
FIG. 2 is a block diagram showing a method of forming and testing a single multichip module, which is depicted in cross-section, in accordance with one embodiment of the present invention.

FIG. 2 is a block diagram showing a method of forming and testing a single multichip module, which is depicted in cross-section, in accordance with one embodiment of the present invention. The method shown in FIG. 2 includes coupling 50 a first set 52 of integrated circuit dies to a substrate 54, where the number of dies in the first set is equal to or greater than one. Each die in first set 52 is then encapsulated 56 and dynamically tested and burned-in 58. If each die within first set 52 is tested and burned-in successfully, a second set 60 of integrated circuit dies are coupled to substrate 54. If one die within first set 52 is not tested or burned-in successfully, i.e., is defective, then subsequent packaging operations intended for substrate 54 are terminated. The number of dies in second set 60 may be any number equal to or greater than one. (To minimize complicating the disclosure, only a single die is shown in first set 52 and second set 60).

The term substrate includes any platform, such as a silicon substrate or equivalent dielectric, suitable for combining more than one integrated circuit die, and includes interconnect I/O pads (not shown) suitable for coupling electrically a selected number of integrated circuit dies. The substrate may have a printed wire circuit or equivalent interconnect on its surface, or it may have multiple layers of the interconnect on and/or within the body of substrate 54. Some common examples known in the art include ceramic, laminate, and/or thin-film based substrates. These substrate types are not intended to limit the present invention in any way but are simply discussed to illustrate various equivalents.

Coupling 50 each die associated with first set 52 to substrate 54 includes physically attaching 62 each die to substrate 54 and electrically coupling 64 their corresponding die I/O pads (not shown) to the interconnect I/O pads of substrate 54. Similarly, coupling 65 each die associated with second set 60 to substrate 54 includes physically attaching 66 each die to substrate 54 and electrically coupling 68 their corresponding die I/O pads (not shown) to the interconnect I/O pads of substrate 54. Electrical coupling may be accomplished by any method or process necessary to meet design requirements as known by those of ordinary skill in the art, such as wiring bonding, flip-chip, and the like. As shown in FIG. 2, the electrical coupling of dies within first 52 and second set 60 to substrate 54 is accomplished using the wiring bonding process.

Substrate 54 also has, for example, multichip module (MCM) I/O pads 70 that are suitable for coupling electrically to a multichip module pin-out 72. As shown in FIG. 2, pin-out 72 may be formed after each die within second set 60 is encapsulated 74 although the order in which pin-out 72 is formed is not intended to be limiting. Pin-out 72 is typically formed 76 opposite to the substrate surface facing the attached integrated circuit die, and is for coupling electrically multichip module 78 to another substrate, such as a printed circuit board (not shown). Pin out 72 may be, but is not limited to, any area connection, e.g., ball grid array (BGA), pin grid array (PGA) or the like, or package configuration (e.g., DIP, SOP, TSOP, SOJ, QFP, or the like). Pin-out 72 is depicted in FIG. 2 as a ball grid array.

Testing of multichip module 78 may be performed either before the formation of pin-out 72 or after (preferred). This step is not shown in FIG. 2 to avoid overcomplicating the disclosure.

In accordance with one preferred embodiment of the present invention, each die within first set 52 is a relatively low value die, while each die within second set 60 is a relatively high value die. For the purposes of this disclosure, the terms "low value" and "high value" are intended to be relative terms. The value of a die includes such factors as the cost to develop and/or manufacture the die, the infant mortality rate of the die, and/or the like. For example, if one or more DRAM integrated circuit die are combined with a graphics controller chip to form a multichip module, then each DRAM die will be considered to be of relatively low value when compared to the graphics controller chip. In this example, a DRAM die is considered a low value die when compared to a graphics controller chip because it is commonly known by those of ordinary skill in the art that most DRAM dies are susceptible to high failure rates after packaging and use (such as bum-in and testing). Failure after packaging is a problem known in the industry as die infant mortality. Hence, the low value DRAM die will be coupled to a substrate encapsulated, tested, and/or burned-in before a high value die is combined with the DRAM die on the substrate.

The above approach solves the known good die problems discussed above because bare die of relatively low value may be tested and/or burned-in before encapsulating relatively high value die to the multichip module. This reduces packaging costs because low value bare die may be directly tested and/or burned in its final package form and improves yield by ensuring that only known good die will be combined with a high value die. In addition, in-package testing avoids introducing constraints outside the target circuit such as capacitance, cross talk and frequency limitations introduced by temporary structures required for testing on bare die.

Figure 3:
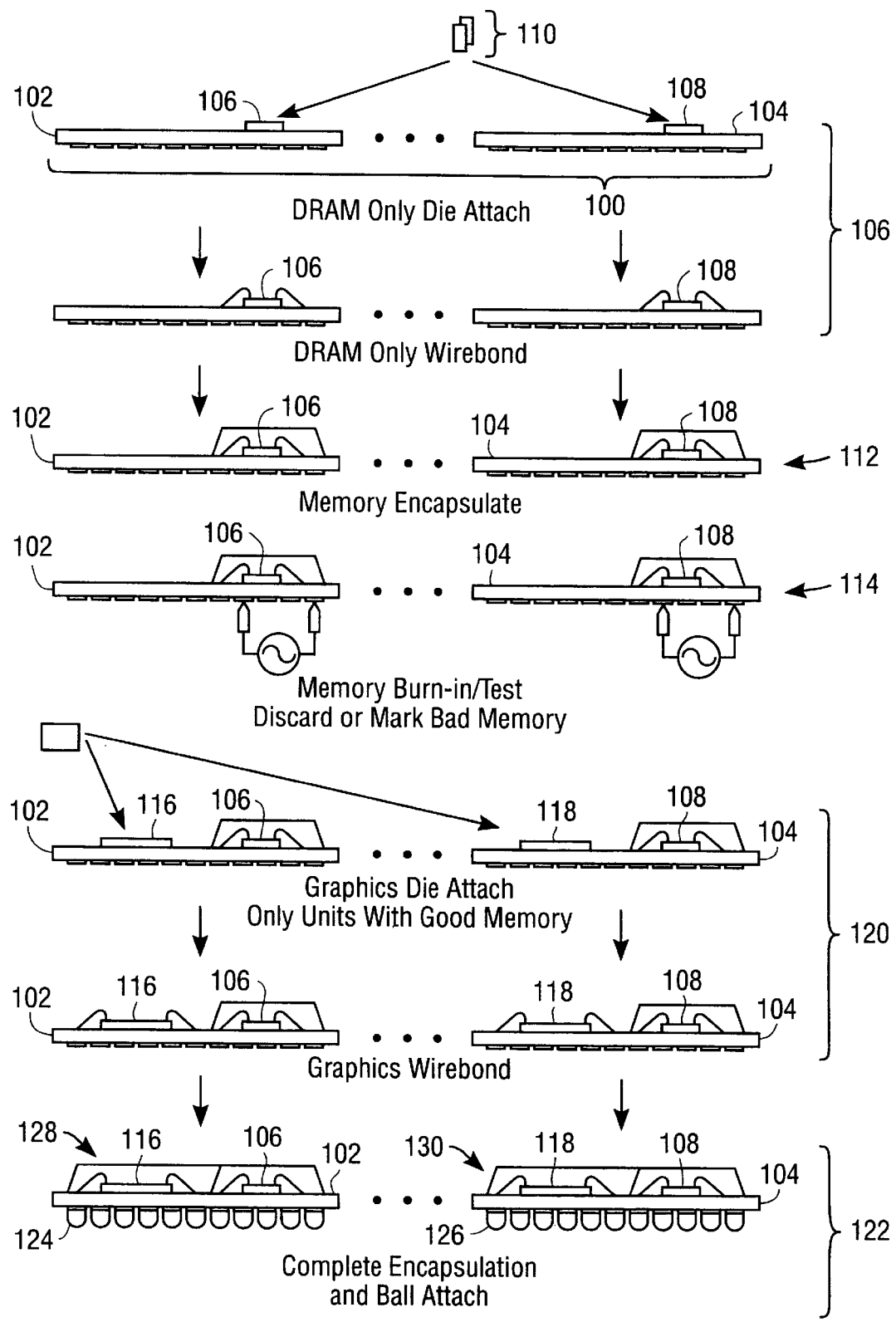
FIG. 3 is a block diagram showing a method of forming and testing more than one multichip module on a substrate strip, in accordance with another embodiment of the present invention.

FIG. 3 is a block diagram showing a process of forming and testing a multichip module on each substrate portion associated with a substrate strip 100 in accordance with another embodiment of the present invention. Each multichip module, its contents, and substrate portion are shown in sectional form. The process is similar to the process shown in FIG. 2 but includes performing the process in parallel.

Substrate strip 100 is shown having more than one substrate portion with each portion detachably attached to each other. In accordance with a presently preferred embodiment of the present invention, substrate strip 100 includes four substrate portions, although the following discussion is limited to substrate portions 102 and 104 to avoid unduly complicating the present discussion. Each substrate portion functions as a packaging substrate for each multichip module fabricated in parallel. Each substrate portion has at least one side that is detachably attached to another substrate portion. Detachable attachment is accomplished by use or formation of of perforation although this is not intended to be in any way limiting.

The process shown in FIG. 3 includes coupling 106 in parallel at least one set of integrated circuit dies to each substrate portion associated with substrate strip 100. In this example, a first set 106 and a second set 108 of integrated circuit dies are shown coupled to substrate portions 102 and 104, respectively. The number of dies 110 in each set is equal to or greater than one. To minimize complicating the within disclosure, only a single die is shown in first set 106 and second set 108. Each die in first set 106 and second set 108 is then encapsulated 112 and dynamically tested and burned-in 114.

After burn-in and testing, only substrate portions having known good die may be subsequently processed as discussed below. Specifically, if each die within first set 106 and 108 is tested and burned-in successfully, a third set 116 and fourth set 118 of integrated circuit dies are coupled 120 to substrate portions 102 and 104. However, if one die within first set 106 is not tested or burned-in successfully, i.e., is defective, then subsequent packaging operations intended for substrate portion 102 are terminated. Similarly, if one die within second set 108 is found defective, then subsequent packaging operations intended for substrate portion 104 are terminated.

The number of dies in third and fourth sets 116 and 118 may be any number equal to or greater than one. (To minimize complicating the disclosure, only a single die is shown in third set 116 and fourth set 118).

Coupling 120 each die associated with third set 116 and fourth set 118 is similar to the coupling step discussed above with respect to FIG. 2.

After coupling, third set 116 and fourth set 118 are encapsulated 122. A pin-out 124 and pin-out 126 may be formed for encapsulated substrate portions 128 and 130, respectively, as well. Testing is then performed on the encapsulated substrate portions 128 and 130. This testing step is not shown in FIG. 3 to avoid overcomplicating the disclosure.

As in the embodiment disclosed in FIG. 2, it is preferred but not required that the dies used in first set 106 and/or second 108 are of relatively lower value than the dies used in third set 118 and/or fourth set 118.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method of packaging and testing integrated circuit die, comprising:

coupling a first integrated circuit die to a substrate;

encapsulating said first integrated circuit die;

testing said first integrated circuit die; and coupling a second integrated circuit die to said substrate if said testing of said first integrated circuit die is successful.

2. The method of claim 1, further including encapsulating said second integrated circuit die.

3. The method of claim 1, further including testing said second integrated circuit die.

4. The method of claim 1, wherein said second integrated circuit die comprises a graphics accelerator circuit.

5. The method of claim 1, wherein said testing of said first integrated circuit die includes dynamic bum-in testing.

6. The method of claim 1, wherein said first integrated circuit die comprises a DRAM circuit.

7. The method of claim 1, wherein said second integrated circuit die has a higher value than said first integrated circuit die.

8. A multichip module produced in accordance with the method of claim 1.

9. A multichip module produced in accordance with the method of claim 2.

10. A method of integrating integrated circuit die with a substrate having a first connection array suitable for coupling to a second connection array provided by a second substrate, comprising:

coupling a first integrated circuit die to the substrate;

encapsulating said first integrated circuit die;

testing said first integrated circuit die after encapsulating said first integrated circuit die; and coupling a second integrated circuit die to the substrate if said testing of said first integrated circuit die is successful.

11. The method of claim 10, further including encapsulating said second integrated circuit die.

12. The method of claim 10, further including testing said second integrated circuit die.

13. A multichip module produced in accordance with the method of claim 10.

14. A multichip module produced in accordance with the method of claim 11.

15. A method of forming a multichip module having at least two integrated circuit die, comprising:

coupling a first integrated circuit die to a first substrate having an array of connections;

encapsulating said first integrated circuit die;

testing said first integrated circuit die after encapsulating said first integrated circuit die; and coupling a second integrated circuit die to said first substrate if said testing of said first integrated circuit die is successful.

16. The method of claim 15, further including encapsulating said second integrated circuit die.

17. The method of claim 15, further including testing said second integrated circuit die.

18. The method of claim 15, wherein said testing of said first integrated circuit includes dynamic bum-in testing.

19. The method of claim 18 wherein said dynamic bum-in testing includes testing of voltage ranges.

20. The method of claim 18 wherein said dynamic burn-in testing includes testing of temperature ranges.

21. The method of claim 15, wherein said array of connections includes a ball grid array.

22. The method of claim 15, wherein said array of connections includes a pin grid array.

23. A multichip module produced in accordance with the method of claim 15.

24. A multichip module produced in accordance with the method of claim 16.

25. A method of packaging at least one known good die onto a substrate strip having at least a first substrate and a second substrate, comprising:

coupling a first integrated circuit die to the first substrate;

encapsulating said first integrated circuit die and a portion of the first substrate associated with said first integrated circuit die;

testing said first integrated circuit die after encapsulation; and coupling a second integrated circuit die to the first substrate if said testing of said first integrated circuit die is successful.

26. A multichip module produced in accordance with the method of claim 25.

27. The method of claim 25, further including marking the first substrate unusable to preclude said coupling of said second integrated circuit die to the first substrate if said testing of said first integrated die is unsuccessful.

28. The method of claim 27, further including:

coupling a third integrated circuit die to the second substrate; and encapsulating said third integrated circuit die and a portion of the second substrate associated with said third integrated circuit die.

29. A multichip module produced in accordance with the method of claim 28.

30. The method of claim 28, further including testing said third integrated circuit die after encapsulation.

31. The method of claim 30, further including coupling a fourth integrated circuit die to the second substrate if said testing of said third integrated circuit die is successful.

32. A multichip module produced in accordance with the method of claim 31.

33. The method of claim 25, wherein said second integrated circuit die includes a graphics accelerator circuit.

34. The method of claim 25, wherein said testing of said first integrated circuit die includes dynamic burn-in testing.

35. The method of claim 25, wherein said first integrated circuit die comprises a DRAM circuit.

36. A method of packaging and testing integrated circuit die, comprising:
 coupling a first set of integrated circuit die to a substrate;
 encapsulating said first set of integrated circuit die;
 testing said first set of integrated circuit die; and
 coupling at least one additional integrated circuit die to said substrate if said testing of said first set of integrated circuit die is successful.

37. The method of claim 36, wherein said at least one additional integrated circuit die has a higher value than said first integrated circuit die.

38. A multichip module produced in accordance with the method of claim 36.

* * * * *